(12) United States Patent
Gearhardt

(10) Patent No.: US 7,042,242 B2
(45) Date of Patent: May 9, 2006

(54) BUILT-IN SELF TEST TECHNIQUE FOR PROGRAMMABLE IMPEDANCE DRIVERS FOR RAPIDCHIP AND ASIC DRIVERS

(75) Inventor: Kevin Gearhardt, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/852,902

(22) Filed: May 25, 2004

(65) Prior Publication Data

US 2005/0264314 A1 Dec. 1, 2005

(51) Int. Cl.
*G01R 31/26* (2006.01)

(52) U.S. Cl. ..................... 324/763; 324/765; 324/158.1

(58) Field of Classification Search ...................... None
See application file for complete search history.

(56) References Cited

U.S. PATENT DOCUMENTS 4,906,916 A * 3/1990 Koslar .................... 324/121 R 6,304,199 B1 * 10/2001 Fang et al. .................. 341/118
6,509,758 B1 * 1/2003 Piasecki et al. ............... 326/37

* cited by examiner

*Primary Examiner*—Minh N. Tang
(74) *Attorney, Agent, or Firm*—Trexler, Bushnell, Giangiorgi & Blacksonte, Ltd.

(57) ABSTRACT

A circuit which includes the addition of test points and analog circuitry required to perform a four-point measurement technique. Test points are fed to an analog multiplexer which is under control of test logic added to the design to facilitate the testing. The output of the analog multiplexer is fed directly to an n-bit Analog-to-Digital Converter (ADC), when the number of bits is determined by the measurement resolution required for the circuit to be tested. The ADC is controlled by digital test logic instantiated in the design to perform the BIST operation. A known current is injected and held constant during the entire BIST operation, and the BIST logic performs voltage measurements. The voltage differential is compared by the BIST circuitry based on the values obtained from the ADC. Then, a pass/fail bit can be passed to a signal pin on the device to be compared by the ATE.

12 Claims, 1 Drawing Sheet

US 7,042,242 B2

BUILT-IN SELF TEST TECHNIQUE FOR PROGRAMMABLE IMPEDANCE DRIVERS FOR RAPIDCHIP AND ASIC DRIVERS

BACKGROUND

The present invention generally relates to production test requirements for testing programmable impedance drivers such as the BZIO buffers contained in RapidChip and ASIC devices.

The problem faced in the manufacturing test environment is that it is a non-ideal situation with respect to the contact resistance that occurs at multiple points between the tester's pin electronics and the actual device-under-test (DUT). These contact resistances are difficult to control at best, and cannot be completely eliminated. As such, they contribute an error component to any resistance measurements that are to be made on the actual DUT. These errors in the measurements result in failing tests during the manufacturing test flow causing product yield issues.

The only existing solutions to the aforementioned problems involve the relaxation of test limits for the DUT, or the elimination of the test altogether. While this can address the manufacturing test problem, it increases the possibility of shipping product that is out of specification. Alternatively, the testing can be done within the specified test limits, and then one is forced to accept any associated yield losses during the manufacturing test process.

As discussed, the disadvantage of the existing solutions as far as changing the test limits is the possibility for shipping product which is out of specification to the customer. If there are no changes made to the test program and the DUT is tested against specified test limits, then the manufacturer will experience yield losses caused by the uncontrollable error components associated with the test process.

FIG. 1 represents the typical circuit for an n-channel device which is to be measured on the DUT, including the error components which are an inherent part of the measurement process. A programmable impedance driver typically consists of several transistor 'legs' which can be selectively turned on to provide varying drive strengths. Regardless of the combination of those various transistor legs, the final effective drive strength can be viewed as a lump-sum resistance of the transistors in their 'ON' state. This is the value $R_{Transistor}$ shown in FIG. 1. The labels 'Ground' and 'Signal Pad' refer to the contact points between the ATE pin electronics and the DUT, while '$R_{Ground}$' and '$R_{SignalPad}$' refer to the contact resistances associated with those connections. These contact resistances are what contribute to the error components of the test measurement, resulting in the inability to accurately test the $R_{Transistor}$ value. The standard approach to measuring the on-resistance of a transistor or transistor network on the ATE is to inject a current at 'Signal Pad' and measure the resultant voltage at the pad. The transistor on-resistance is then calculated using Ohm's law, or R=V/I. The problem is that the calculated on-resistance includes the unknown error components associated with '$R_{Ground}$' and '$R_{SignalPad}$'.

OBJECTS AND SUMMARY

An object of an embodiment of the present invention is to provide a built-in self test (BIST) approach to testing one or more programmable impedance drivers, where the approach effectively eliminates error components of the typical measurement approach which is currently used.

Briefly, an embodiment of the present invention provides a built-in self test (BIST) approach to testing one or more programmable impedance drivers. Test points are added within the circuit to be tested that facilitate a four-point measurement technique on-chip, with the addition of an analog-to-digital converter (ADC) and the digital logic necessary to complete the measurements and validation of those measurements.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION

Figure 1:
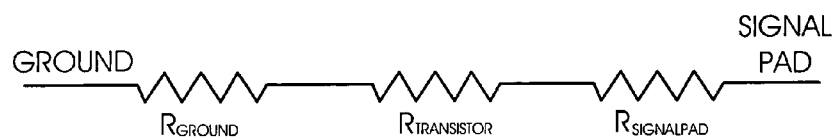
FIG. 1 is an illustration which represents the typical circuit for an n-channel device which is to be measured on the DUT, including the error components which are an inherent part of the measurement process.

While the invention may be susceptible to embodiment in different forms, there is shown in the drawings, and herein will be described in detail, a specific embodiment of the invention. The present disclosure is to be considered an example of the principles of the invention, and is not intended to limit the invention to that which is illustrated and described herein.

The basic premise of the present invention is a built-in self test (BIST) approach to testing one or more programmable impedance drivers. Specifically, test points are added within the circuit to be tested that facilitate a four-point measurement technique on-chip, with the addition of an analog-to-digital converter (ADC) and the digital logic necessary to complete the measurements and validation of those measurements. The four-point measurement approach eliminates the error components of the measurement discussed above.

As discussed above, FIG. 1 represents the typical circuit for an n-channel device which is to be measured on the DUT, including the error components which are an inherent part of the measurement process. A programmable impedance driver typically consists of several transistor 'legs' which can be selectively turned on to provide varying drive strengths. Regardless of the combination of those various transistor legs, the final effective drive strength can be viewed as a lump-sum resistance of the transistors in their 'ON' state. This is the value $R_{Transistor}$ shown in FIG. 1. The labels 'Ground' and 'Signal Pad' refer to the contact points between the ATE pin electronics and the DUT, while '$R_{Ground}$' and '$R_{SignalPad}$' refer to the contact resistances associated with those connections. These contact resistances are what contribute to the error components of the test measurement, resulting in the inability to accurately test the $R_{Transistor}$ value. The standard approach to measuring the on-resistance of a transistor or transistor network on the ATE is to inject a current at 'Signal Pad' and measure the resultant voltage at the pad. The transistor on-resistance is then calculated using Ohm's law, or R=V/I. The problem is that the calculated on-resistance includes the unknown error components associated with '$R_{Ground}$' and '$R_{SignalPad}$'.

Figure 2:
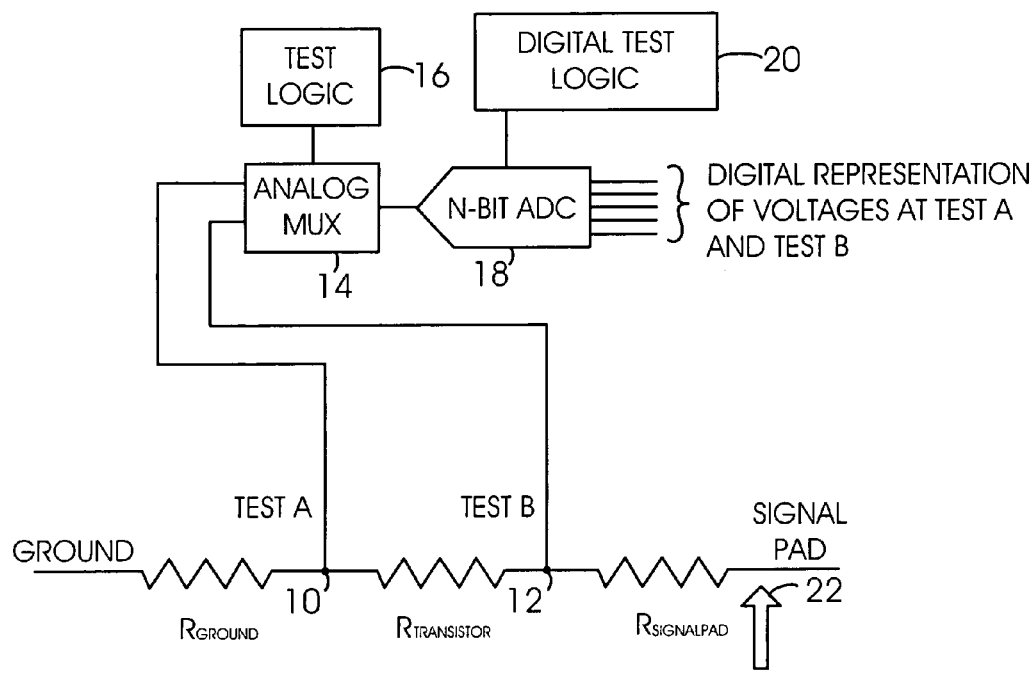
FIG. 2 is an illustration which represents the modified circuit for an n-channel device which is to be measured on the DUT, wherein the circuit is in accordance with an embodiment of the present invention and reflects the addition of the test points and analog circuitry required to perform the four-point measurement technique.

FIG. 2 represents the modified circuit for an n-channel device which is to be measured on the DUT, and reflects the addition of the test points 10, 12 and analog circuitry required to perform the four-point measurement technique. The labels 'Test A' and 'Test B' represent the added test points required to perform the four-point measurement. These test points are fed to an analog multiplexer 14 which is under control of test logic 16 added to the design to facilitate the testing. The output of the analog multiplexer 14 is fed directly to an n-bit Analog-to-Digital Converter (ADC) 18, when the number of bits 'n' is determined by the measurement resolution required for the circuit to be tested. The ADC 18 is controlled by digital test logic 20 instantiated in the design to perform the BIST operation. A known current (represented with arrow 22 in FIG. 2) is injected at 'Signal Pad' and held constant during the entire BIST operation. The BIST logic performs two measurements to obtain the voltages at 'Test A' and 'Test B'. Given a known current injected at 'Signal Pad' and a previously defined acceptable range for $R_{Transistor}$, the voltage differential between 'Test A' and 'Test B' is defined by Ohm's law as ((Voltage @ (Test B)–(Voltage @ Test A))=$R_{Transistor}$*(Injection Current). This voltage differential will have a range defined by the acceptable variation Of $R_{Transistor}$, and can be digitally compared by the BIST circuitry based on the values obtained from the ADC. Then, a simple pass/fail bit can be passed to a signal pin on the device to be compared by the ATE.

The primary feature of the present invention is the ability to do accurate ATE testing of a DUT's programmable impedance driver(s) which represent only actual on-resistance values of those drivers. This is made possible by the addition of test points and the appropriate analog and digital test logic to perform a four-point measurement style BIST operation on-chip, negating the typical measurement errors seen in the ATE environment.

The primary advantage of the present invention is that it can be implemented in association with any device which requires the testing of on-chip programmable impedance drivers. No additional device pads are required to accomplish the testing. The inclusion of the necessary ADC and digital control logic allows the device to effectively test itself with minimal intervention by the ATE. The number of programmable impedance drivers which can be tested is dictated by the acceptable test time associated with the BIST operation, so for designs which contain large numbers of these pads, it will be likely that only a sample be tested to guarantee circuit performance relative to wafer fabrication processing parameters. Any pads not tested via the BIST approach would require testing under the typical lower-accuracy approach currently in use, just to ensure there are not gross errors associated with the fabrication of those pads.

While embodiments of the present invention are shown and described, it is envisioned that those skilled in the art may devise various modifications of the present invention without departing from the spirit and scope of the appended claims.

What is claimed is:

1. A circuit for testing a programmable impedance driver, said circuit being disposed between ATE pin electronics and a DUT, said circuit comprising: a plurality of contact points; a multiplexer having an input and an output; an ADC having an input and a plurality of outputs; leads between said contact points and said input of said multiplexer, said output of said multiplexer being connected to said input of said ADC, circuitry operably connected to said multiplexer and said ADC, said circuitry configured to control said multiplexer and said ADC such that a digital representation of voltages at the contact points is provided at the outputs of said ADC.

2. A circuit as recited in claim 1, wherein said plurality of contact points comprises two contact points.

3. A circuit as recited in claim 1, wherein said multiplexer comprises an analog multiplexer.

4. A circuit as recited in claim 1, wherein said circuitry connected to said multiplexer comprises test logic configured to facilitate the testing.

5. A circuit as recited in claim 1, wherein said circuitry connected to said ADC comprises digital test logic configured to perform a BIST operation.

6. A circuit as recited in claim 5, wherein said digital test logic is configured to perform two measurements to obtain the digital representation of voltages at the contact points at the outputs of said ADC.

7. A method for testing a programmable impedance driver, said method comprises using a circuit being disposed between contact points of ATE pin electronics and a DUT, said circuit comprising a plurality of contact points; a multiplexer having an input and an output; an ADC having an input and a plurality of outputs; leads between said contact points and said input of said multiplexer, said output of said multiplexer being connected to said input of said ADC, circuitry operably connected to said multiplexer and said ADC, said circuitry configured to control said multiplexer and said ADC such that a digital representation of voltages at the contact points is provided at the outputs of said ADC, said method further comprising applying a predetermined current at a contact point at the DUT, and using the circuit to obtain, at the outputs of the ADC, said digital representation.

8. A method as recited in claim 7, further comprising using two contact points of the circuit.

9. A method as recited in claim 7, further comprising using an analog multiplexer as said multiplexer.

10. A method as recited in claim 7, further comprising using test logic connected to said multiplexer to facilitate the testing.

11. A method as recited in claim 7, further comprising using digital test logic configured to perform a BIST operation, said digital test logic being connected to said ADC.

12. A method as recited in claim 11, further comprising using said digital test logic to perform two measurements to obtain the digital representation at the output of said ADC.

* * * * *